United States Patent
Wolf

(10) Patent No.: US 10,232,832 B2
(45) Date of Patent: Mar. 19, 2019

(54) EMERGENCY BREAKAWAY SYSTEM HAVING AN INTEGRAL ELECTRICAL TESTING SYSTEM

(71) Applicant: Paul Wolf, Mandan, ND (US)

(72) Inventor: Paul Wolf, Mandan, ND (US)

(*) Notice: Subject to any disclaimer, the term of this patent is extended or adjusted under 35 U.S.C. 154(b) by 55 days.

(21) Appl. No.: 14/964,330

(22) Filed: Dec. 9, 2015

(65) Prior Publication Data

US 2016/0167630 A1 Jun. 16, 2016

Related U.S. Application Data

(60) Provisional application No. 62/089,905, filed on Dec. 10, 2014.

(51) Int. Cl.
| | | |
|---|---|---|
| *B60T 7/20* | (2006.01) | |
| *B60T 13/74* | (2006.01) | |
| *B60T 17/22* | (2006.01) | |
| *G01R 31/00* | (2006.01) | |

(52) U.S. Cl.
CPC ............... *B60T 7/20* (2013.01); *B60T 13/741* (2013.01); *B60T 17/221* (2013.01); *G01R 31/006* (2013.01)

(58) Field of Classification Search
CPC .......... B60T 7/20; B60T 8/1708; B60T 13/08; B60T 13/66; B60T 13/586; B60L 7/26
USPC ................. 188/158; 303/7, 15, 152
See application file for complete search history.

(56) References Cited

U.S. PATENT DOCUMENTS

| | | | | |
|---|---|---|---|---|
| 4,052,695 A | * | 10/1977 | Myers | B60Q 1/44 188/3 R |
| 6,364,432 B1 | * | 4/2002 | Mixon | B60T 7/20 303/124 |
| 2002/0038974 A1 | * | 4/2002 | Lamke | B60T 11/108 303/7 |
| 2003/0038534 A1 | * | 2/2003 | Barnett | B60T 8/1708 303/7 |
| 2006/0214506 A1 | * | 9/2006 | Albright | B60T 7/20 303/123 |
| 2006/0279291 A1 | * | 12/2006 | Fielding | G01R 1/04 324/503 |
| 2009/0009304 A1 | * | 1/2009 | Lacasse | G01R 31/006 340/431 |
| 2013/0264863 A1 | * | 10/2013 | McCollum | B60Q 11/00 307/9.1 |

* cited by examiner

*Primary Examiner* — Robert A. Siconolfi
*Assistant Examiner* — San M Aung
(74) *Attorney, Agent, or Firm* — The Keys Law Firm PLLC

(57) ABSTRACT

An emergency breakaway system having an integral electrical testing system for confirming the functionality of a trailer's electric brake solenoids and electric lights includes housing enclosure having interface screen, a testing battery, and a testing controller. The trailer electrical system testing device is operative to replace a conventional emergency breakaway system, supplying the emergency breakaway functionality while also enabling real time, on demand testing of the trailer's electric brakes and lights. An integrated activation routine causes electricity to be supplied directly to the electric brakes in periodic, on/off intervals, thereby operating the electric brakes intermittently, for a predetermined time period. The activation routine thus allows a user to walk around the trailer and listen for activation of the electric brake solenoids as well as check and verify the functionality of the brake components.

20 Claims, 7 Drawing Sheets

EMERGENCY BREAKAWAY SYSTEM HAVING AN INTEGRAL ELECTRICAL TESTING SYSTEM

CROSS REFERENCE TO RELATED APPLICATIONS

This application claims the benefit of and incorporates by reference U.S. provisional patent application Ser. No. 62/089,905 filed Dec. 10, 2014 and incorporates by reference prior application U.S. patent application Ser. No. 12/798,768, filed Apr. 12, 2010, now U.S. Pat. No. 8,947,096.

BACKGROUND OF THE INVENTION

Field of the Invention

This invention relates generally to electrical testing system and, more particularly, to a testing system integrated with an emergency breakaway system installed on a trailer that enables the testing of the functionality of the trailer lighting system and the emergency breakaway braking system.

Description of the Prior Art

It is well established that all recreational trailers and light commercial trailers with 2 or more axles are required to have electric brakes as well as an emergency breakaway system operating therewith. Accordingly, the use and design of conventional emergency breakaway systems in recreational trailers and light commercial trailers is well known. In typical embodiments, a conventional emergency breakaway system installed on a trailer comprises a system housing that includes an emergency battery mounted on the trailer, an operating switch, and an actuating cable. The emergency battery is electrically connected to the electric brake system with conventional wiring by way of the operating switch. The operating switch, which is configured to facilitate the provision of electricity from the emergency battery to the electric brake system, is generally attached somewhere on the trailer. The actuating cable is attached to both the operating switch and the vehicle towing the trailer. Accordingly, if the trailer gets disconnected from the towing vehicle, the actuating cable actuates the operating switch to cause current from the emergency battery in the breakaway system to be supplied to the electric brake circuit, activating the electric brakes and stopping the trailer from rolling unrestrained down the roadway.

A problem which exists, however, is that with conventional emergency breakaway systems, difficulties arise in enabling an operator to confirm the ongoing operation of the emergency breakaway system, particularly, the emergency battery and the brake solenoids, to confirm they remain operational. Indeed, by its very nature, the components of an emergency breakaway system are only used in (ideally) rare situations; such as when a trailer has become disconnected and is rolling down the interstate at 70 mph.

Thus, there remains a need for an emergency breakaway system having an integral electrical testing system that can be employed in place of a conventional emergency breakaway system and enable various testing protocols for its components. It would be helpful if such an emergency breakaway system having an integral electrical testing system was operative to implement an automated testing routine that operated the electric brakes intermittently for a predetermined time interval, thereby enabling an operator to visually inspect each of the trailer's electric brakes during testing. It would be additionally desirable for such an emergency breakaway system having an integral electrical testing system to include testing protocols for a trailer light system.

The Applicant's invention described herein provides for a testing system adapted to verify the operation and operability of components of a conventional emergency breakaway system and trailer light system. The primary components of Applicant's emergency breakaway system having an integral electrical testing system are a testing controller and testing battery housed in a discrete enclosure, as well as electric connectors for electrically connecting the testing controller and testing battery to the emergency breakaway system and trailer lighting system wiring harness. When in use, the emergency breakaway system having an integral electrical testing system allows an operator to check the charging status of the battery of the emergency breakaway system and the activation of the trailer brake solenoids, as well as the functionality of the trailer's lighting system. As a result, many of the limitations imposed in the prior art are removed.

SUMMARY OF THE INVENTION

An emergency breakaway system having an integral electrical testing system for confirming the functionality of the trailer brake solenoids and trailer light functionality of an emergency breakaway system on a trailer. The emergency breakaway system having an integral electrical testing system comprises a modified emergency breakaway system which includes a housing enclosure having interface screen, a testing battery, and a testing controller. The emergency breakaway system having an integral electrical testing system is operative to replace an emergency breakaway system on a target trailer and employ the testing controller to sense the charge status of its battery and selectively supply electrical power from the testing battery to the electric brakes on the target trailer. An activation routine for brake testing may be run to cause electricity to be automatically supplied in periodic, on/off intervals, thereby operating the electric brakes intermittently, for a predetermined time period. As such, the activation routine allows a user to walk around the trailer and listen for activation of the electric brake solenoids as well as check and verify the functionality of the brake components.

The integral electrical testing system of the modified emergency breakaway system additionally includes electrical connections and software which enable it to connect to a trailer lighting system and perform the light testing routines.

It is an object of this invention to provide an emergency breakaway system having an integral electrical testing system that can be employed in place of a conventional emergency breakaway system and enable various testing protocols for its components.

It is another object of this invention to provide an emergency breakaway system having an integral electrical testing system which is operative to implement an automated testing routine that operated the electric brakes intermittently for a predetermined time interval, thereby enabling an operator to visually inspect each of the trailer's electric brakes during testing.

It is yet another object of this invention to provide an emergency breakaway system which has an integral electrical testing system to include testing protocols for a trailer light system.

DETAILED DESCRIPTION OF THE INVENTION

Figure 1:
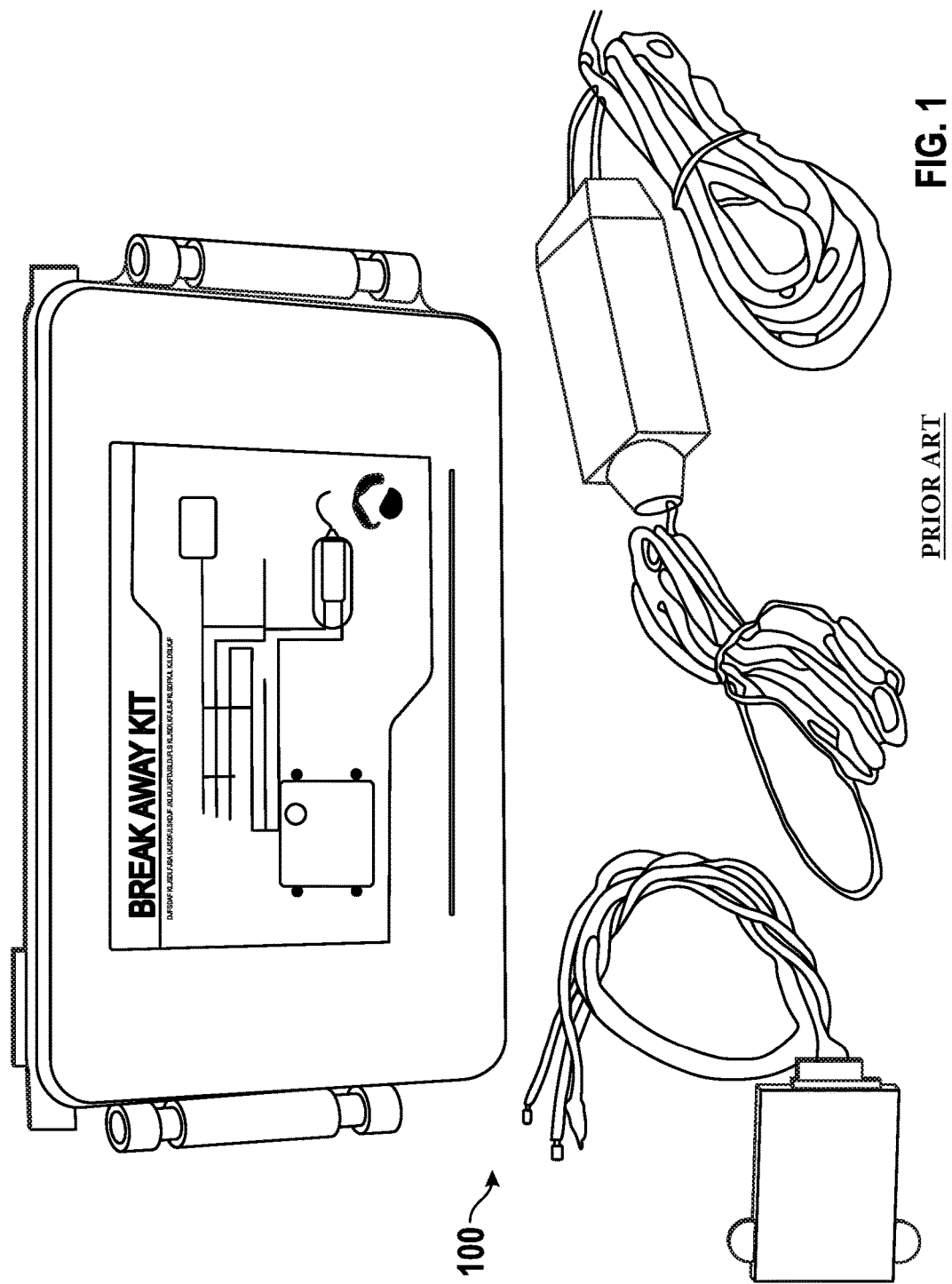
FIG. 1 shows a front perspective view of an exemplary emergency breakaway system built in accordance with the prior art.
Figure 2:
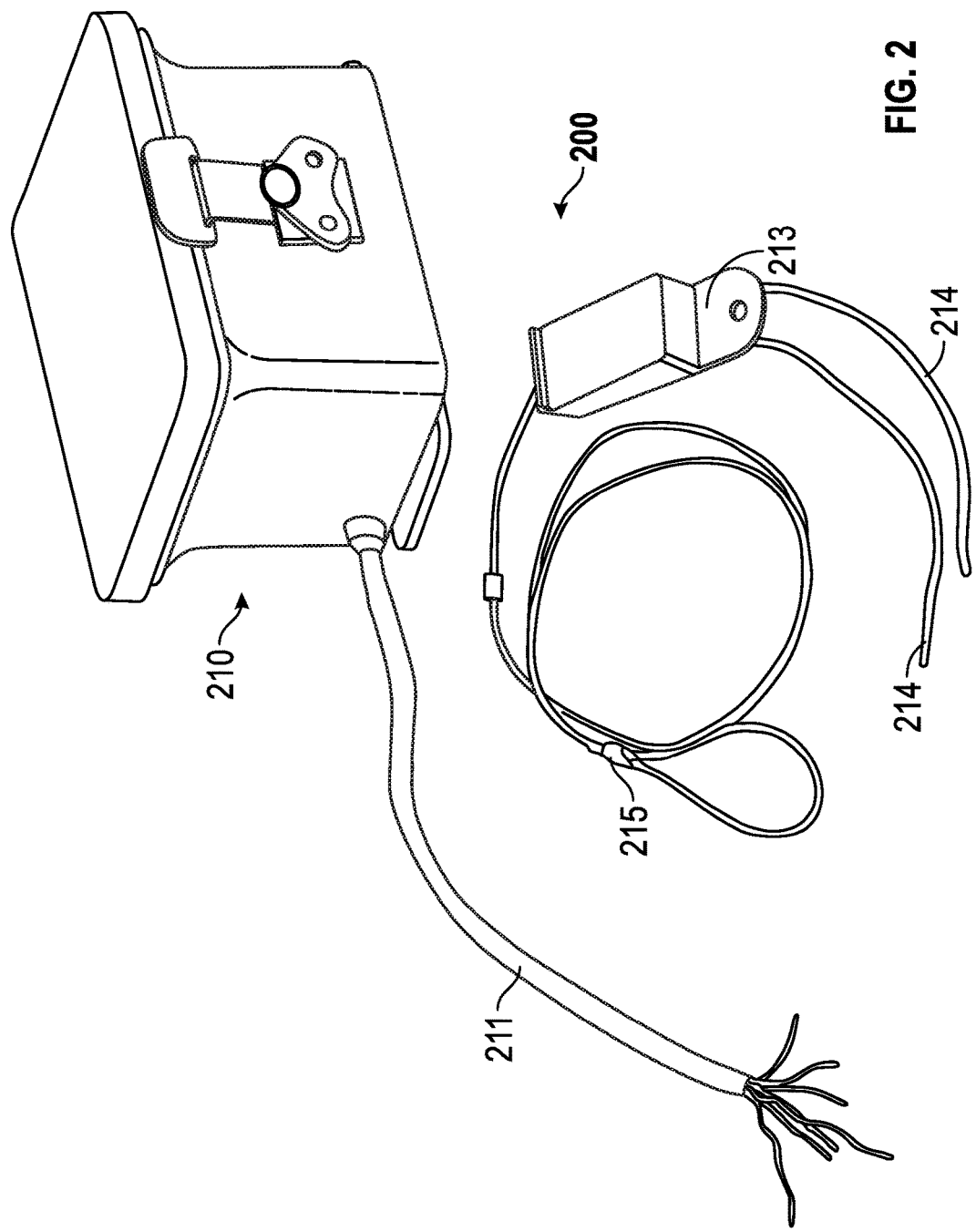
FIG. 2 shows a front perspective view of the components of an emergency breakaway system having an integral electrical testing system built in accordance with the preferred embodiment of the present invention, with its housing enclosure in a closed position.

Referring now to the drawings and in particular FIGS. 1, 2, 3, and 4, an emergency breakaway system having an integral electrical testing system 200 is shown as a housing enclosure 210 having a wiring cable 211 and an interface screen 220, with the interface screen disposed under a hingedly attached top piece 212, as well as an operating switch 213 which includes connection wires 214 and an actuating cable 215. Under the interface screen 220 is a testing battery (not shown) and testing controller (not shown), each electrically connected to one another. The testing controller is operative to selectively direct the supply of electrical power from the testing battery to (1) the electrical components of a trailer lighting system (in the same manner as discussed below in reference to FIGS. 5-8) and (2) the electrical brakes on a trailer. In the preferred embodiment, the testing controller defines a programmable logic controller operative selectively providing and removing electricity to the electrical components of the above referenced trailer electrical systems as described herein. This includes having software containing instructions which cause it to run specified preset testing routines that involve providing and removing electricity on preset time intervals.

With respect to the trailer lighting system, as disclosed in application No. '768 and herein, it is contemplated that the housing enclosure 210 defines an updated version of the "portable housing 10." Thus, the wiring cable 211 of the housing enclosure 210 includes discrete wires which are connectable to a conventional trailer light wiring harness (not shown) of a conventional trailer lighting system and so as to electrically connect the conventional trailer lighting system to the testing controller. Furthermore, it is contemplated that the testing controller includes instructions which enable it to perform each of the light testing routines specified herein.

To enable testing of conventional emergency brakes as well as operation as an emergency breakaway system, the wiring cable 211 additionally includes wires that are connectable (1) directly to electric brakes of the trailer and (2) the operating switch 213 by way of one of the connection wires 214. It is contemplated that the connection wire 214 which is not connected to the wiring cable 211 will also be connected to the trailer's electric brakes.

Accordingly, the connection of the wiring cable 211 provides a conventional electrical connection with the operating switch 213, thereby enabling operation as a conventional emergency breakaway system as well as a direct electrical connection with the electric brakes which facilitates the selective provision of electricity from the testing battery to the electric brakes of the target trailer, bypassing its conventional action which provides electricity from the emergency battery of the emergency breakaway system 10 when it is actuated through a pull from its actuating cable when the trailer becomes disconnected from a towing vehicle.

In addition, the housing enclosure 210 includes a battery sensor which is integrated with the testing controller and the testing battery, thereby allowing the testing controller to monitor the charge status of the battery and activate a visual indication thereof on the interface screen 220.

Accordingly, in operation, the emergency breakaway system having an integral electrical testing system 200 is used in place of a conventional emergency breakaway system 100, with the testing controller operative to determine the charge status of the testing battery and display the same in addition to selectively running an electric brake activation routine and lighting system testing routines. The display of the charging status of the battery is displayed through a battery display section 221 on the interface screen 30.

The activation routine, embodied in software available to the testing controller which provide instructions thereto, may be initiated by manual actuation of an activate electric brake button 222 on the interface screen 220. The activation routine defines a programmed testing cycle which intermittently supplies electricity directly to the trailer electric brakes for a set period of time which allows the operator to activate the electric brakes for the operator to check if the trailer brake solenoids are activating. In the illustrated embodiment, the activation routine is set to run for a three minute cycle (preventing it from ever being inadvertently left on when a trailer is in use). At the end of a cycle, the operator can start a new three minute cycle by simply pressing the activate electric brake button 222 again.

It is noted that in alternate embodiments, the activation routine may alternatively or additionally be set to run in cycles of variously lengths, such as a one minute cycle or a two minute cycle. In such alternate embodiments, the cycle length may be determined by the duration the user holds the activate electric brake button 222.

Once the activation routine begins, the testing controller causes electricity to be supplied from the testing battery to the electric brakes of the target trailer in 2 second, on/off intervals, thereby operating the electric brakes intermittently. This allows the operator or technician performing the test to walk around the trailer and listen for activation of the electric brake solenoids as well as check and verify the functionality of the brake components. The green LED indicator light 223 disposed next to the activate electric brake button will flash in correspondence with the on/off interval.

In its ordinary operation, the activation routine does not provide any Fault feedback. It only activates the electric brakes so the operator or technician can observe and verify that the electric brakes are operating.

As with conventional emergency breakaway systems, the operating switch 213 includes a manual pull cord actuating cable 215 which provides a manual mechanism for causing electricity to be supplied from the testing battery to the electric brakes of the trailer through the operating switch 213.

It is contemplated that the emergency breakaway system having an integral electrical testing system 200 is desirably mounted onto a target trailer, from which it may be permanently or temporarily wired to the electric brakes described above (directly and through the operating switch 213).

Referring now to FIGS. 5, 6, 7, and 8, the trailer light testing capability of the emergency breakaway system having an integral electrical testing system is described with reference to a device which defines legacy lighting testing embodiment. It is appreciated that the testing controller in accordance with the instant invention includes the functionality of the light mode microcontroller 42 and fault detection microcontroller 46.

The device is comprised of a compact portable housing 10 of sufficient size to house and support all of the components and functions related to the invention and subsequently described. The compact portable housing 10 is comprised of any number of materials specifically suited to its function. The housing 10 is generally rectilinear shaped having four vertical sidewalls and a horizontal floor. The top side 14 of the housing 10 contains a fixedly attached handle 12 of a size and dimension suitable to be grasped by a commonly sized human hand. The handle 12 is used to relocate the housing 10 and enables the convenient portability of the device. The removably attached housing top side 14 provides access to the internal components of the device should maintenance or replacement of those components become necessary.

Figure 5:
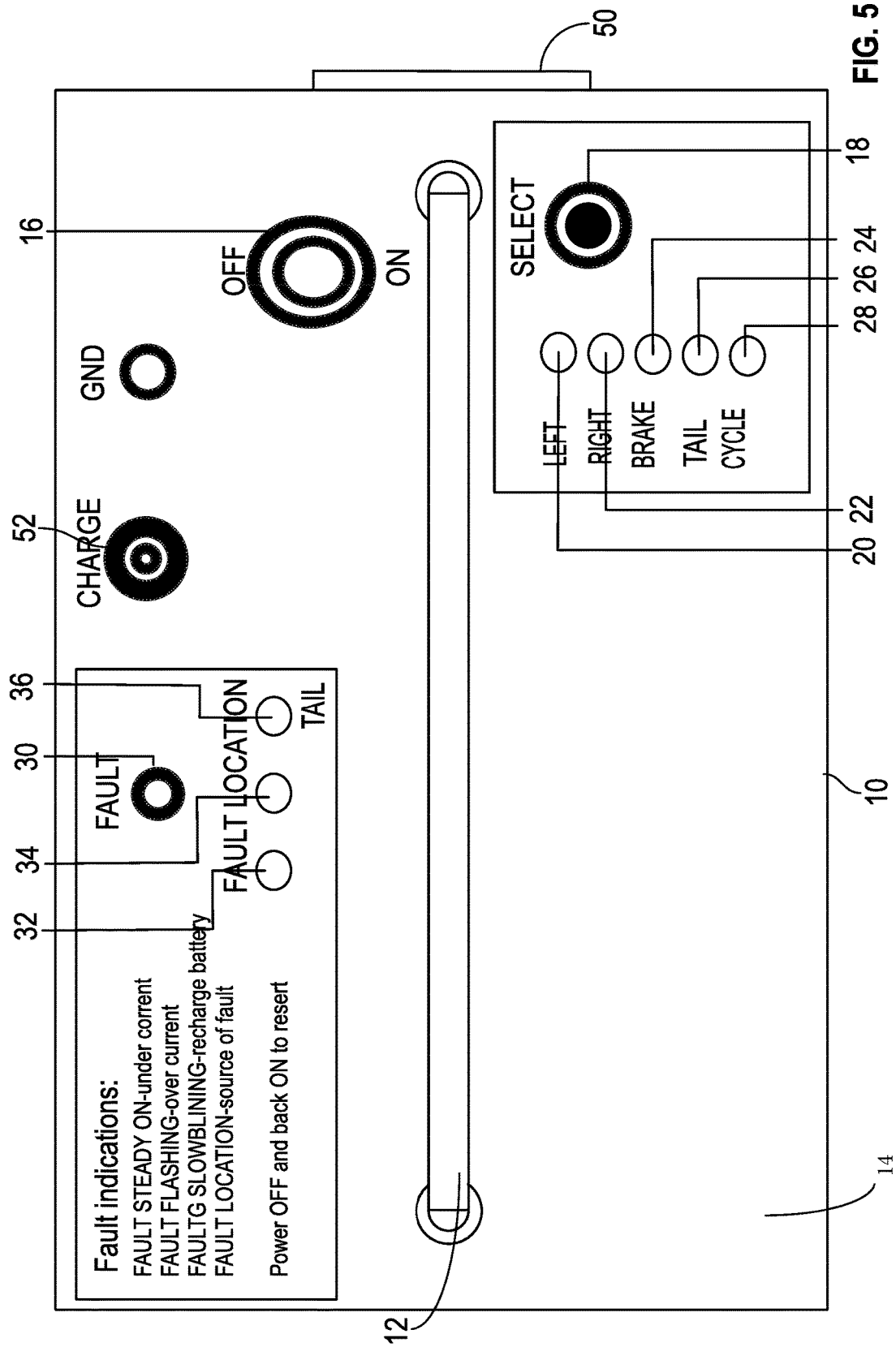
FIG. 5 shows a top plan view of the testing interface of a trailer light tester embodiment built in accordance with an alternate embodiment of the present invention.
Figure 6:
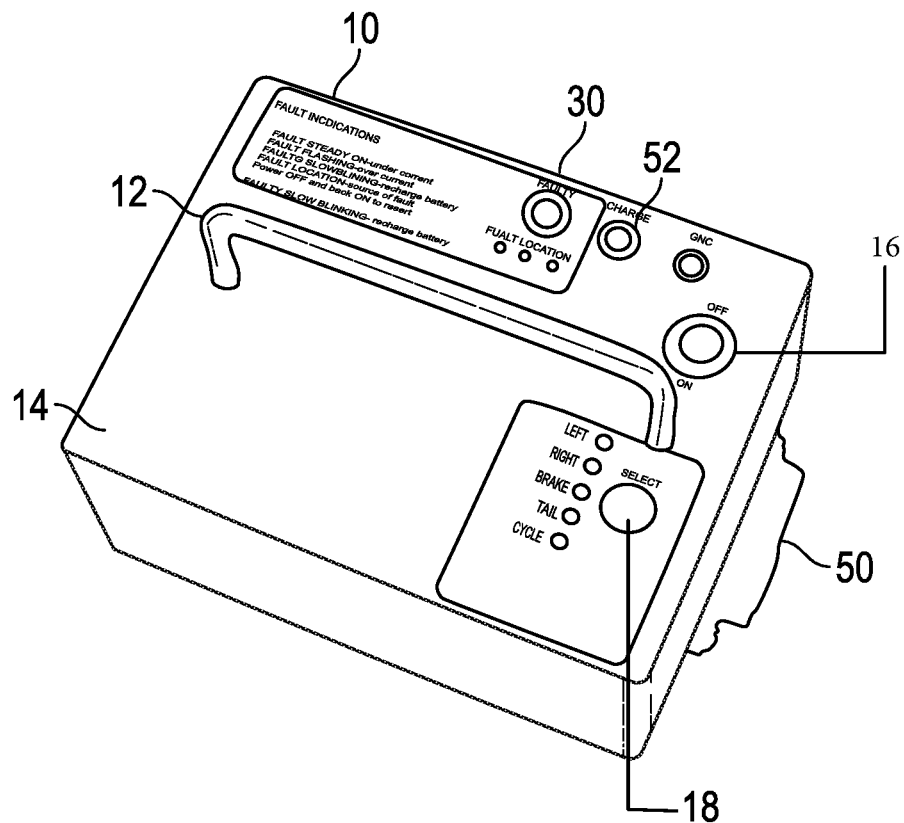
FIG. 6 shows a perspective side view of the testing interface of a trailer light tester embodiment built in accordance with an alternate embodiment of the present invention.
Figure 7:
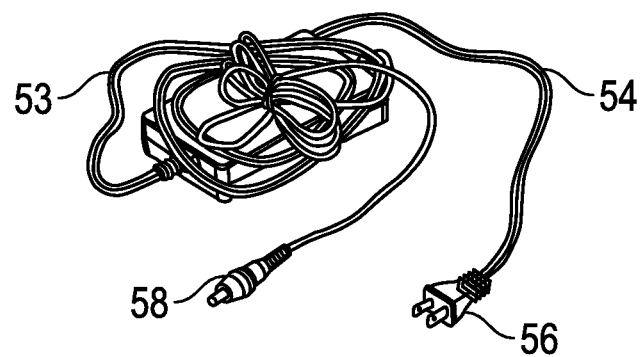
FIG. 7 shows a top perspective view of the AC/DC adapter for use in recharging the power source of the testing interface of a trailer light tester embodiment built in accordance with an alternate embodiment of the present invention.

On the housing top side 14 are a plurality of switches and lights. As seen in FIGS. 5 and 6, the switches include an on/off switch means 16 for connecting or disconnecting the power source as from the rest of the device. The top side further contains a light mode selector button 18 which is manually actuated to select from four individual light modes; left turn signal 20, right turn signal 22, brake lights 24 and tail lights 26. The light mode selector button 18 may also be actuated to select a cycle mode 28 that rotates through the turn signals, brake lights and tail lights at a predetermined time interval. The top side 14 also contains a main fault indicator light 30 and location fault indicator lights for the left side 32, the right side 34 and the tail lights 36. The main fault indicator light 30 informs the user of the type of fault encountered while the location fault indicator lights 32, 34, 36 identify the location of the recognized fault.

Figure 3:
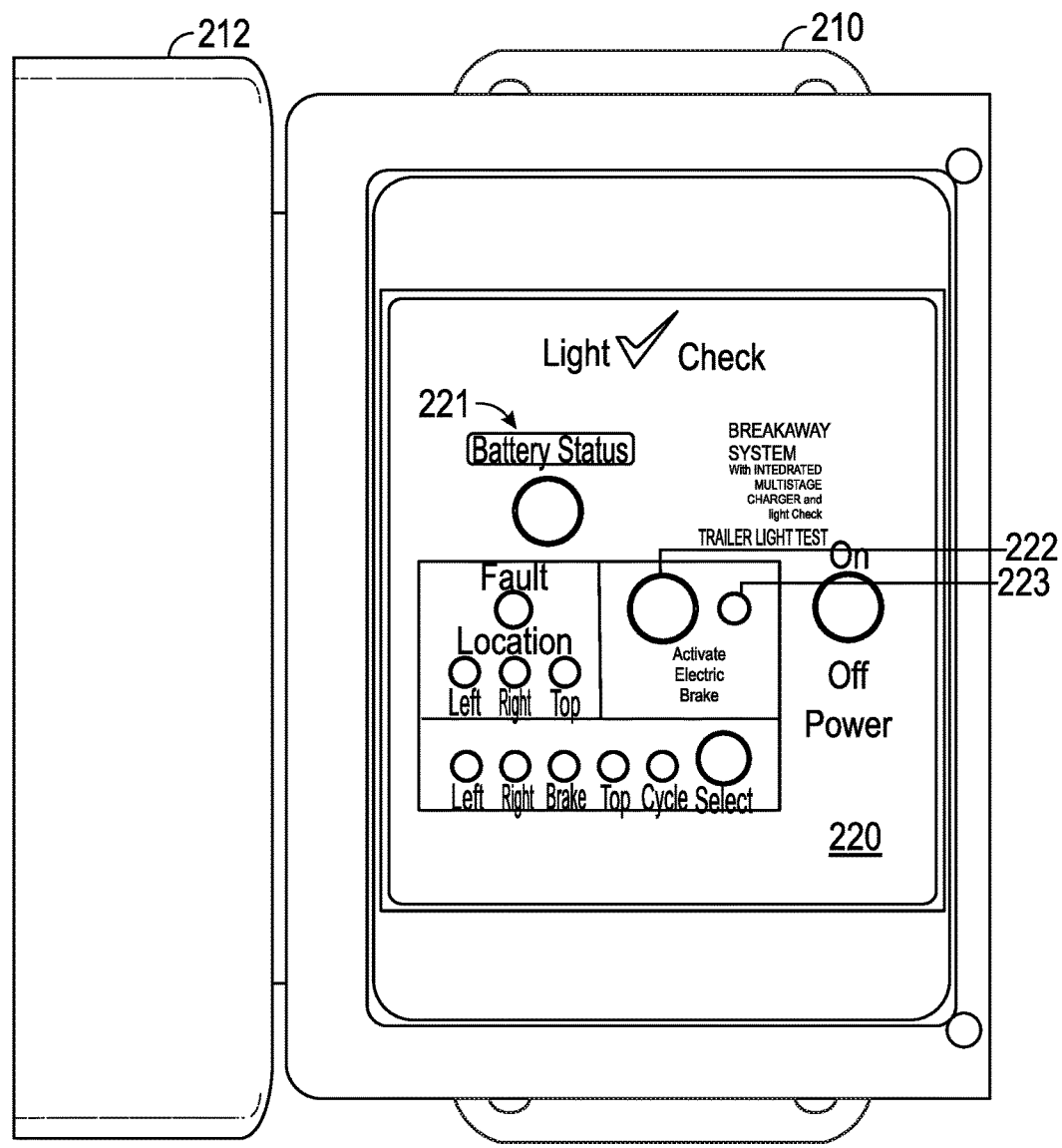
FIG. 3 shows a top plan view of the testing interface of an emergency breakaway system having an integral electrical testing system built in accordance with the preferred embodiment of the present invention, with its housing enclosure in an open position.
Figure 4:
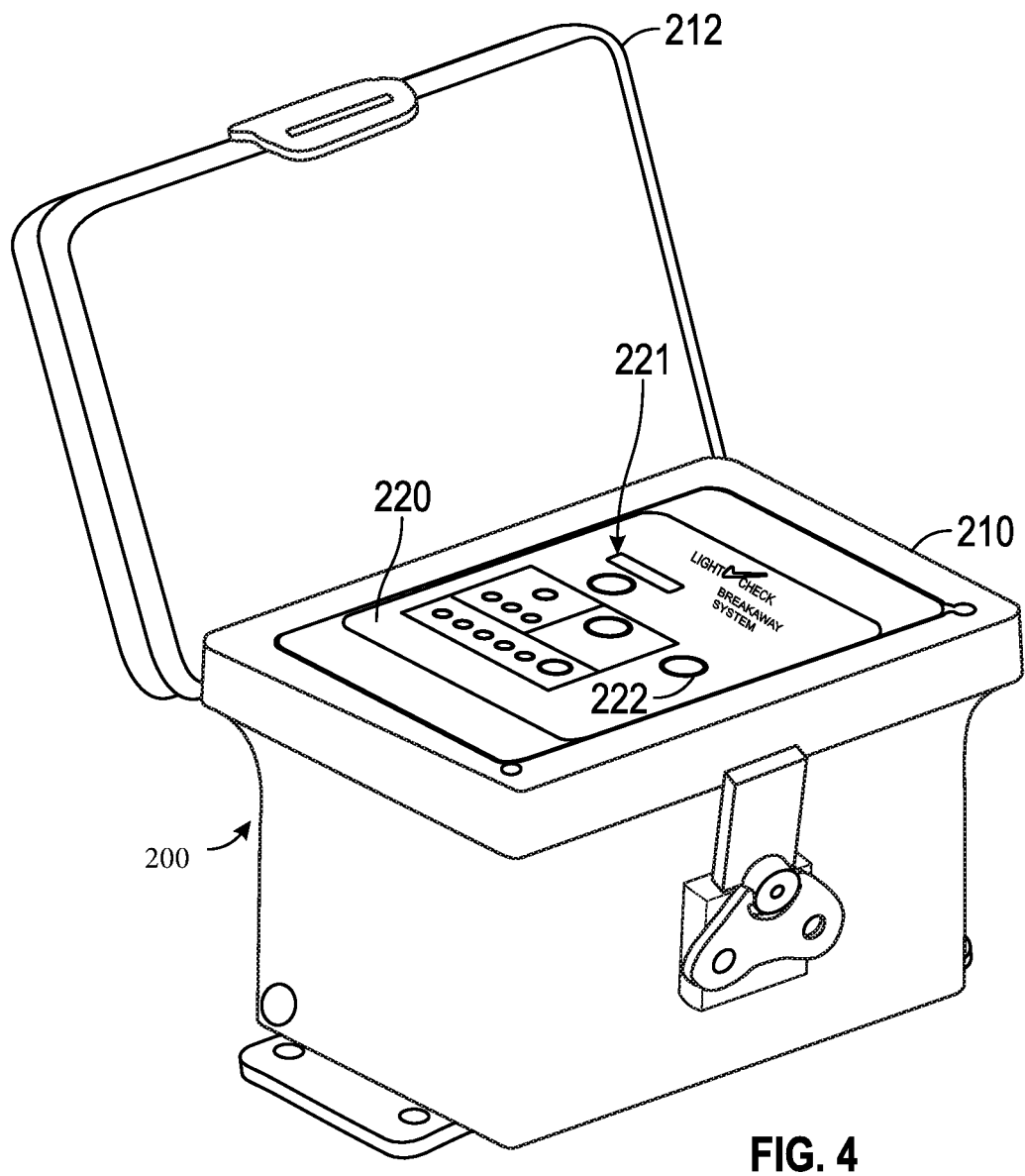
FIG. 4 shows a front perspective view of the housing enclosure of an emergency breakaway system having an integral electrical testing system built in accordance with the preferred embodiment of the present invention in an open position.
Figure 8:
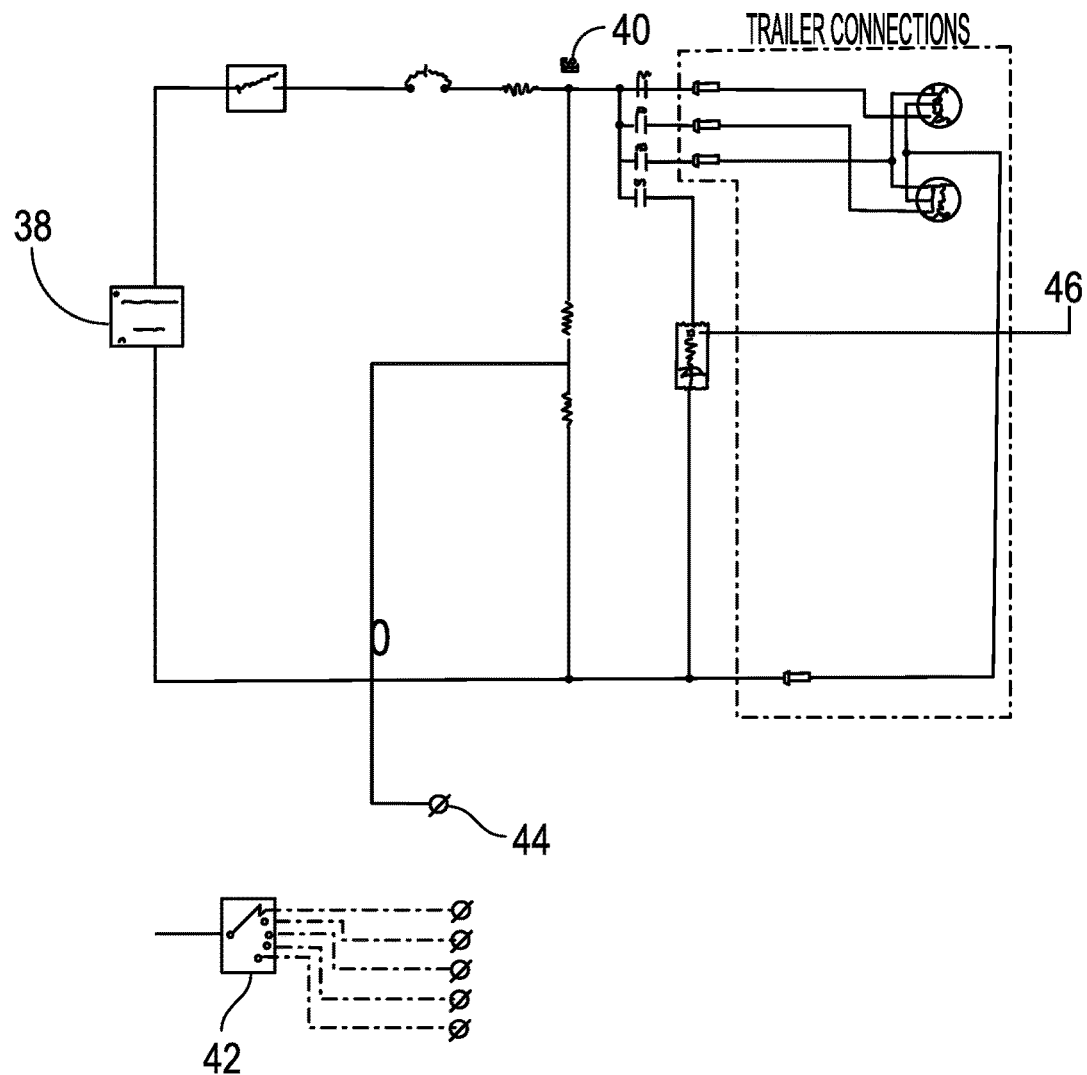
FIG. 8 shows is a wiring schematic of one embodiment of the operational and diagnostic means of the testing interface of a trailer light tester embodiment built in accordance with an alternate embodiment of the present invention.

FIG. 8 illustrates a schematic diagram of the preferred electrical circuitry employed in the light testing device. As depicted in FIG. 8, within the compact portable housing 10 is a self-contained rechargeable 12 volt power source 38 of sufficient capacity to power all functionality over a sustained period of time. The power source 38 is actuated by means of the on/off switch 16. On the top side 14 of the housing 10 is a power source recharge inlet 52 which enables the recharging of the power source 38 without removing the housing top side 14. Referring to FIG. 3, to recharge the power source 38, an AC/DC adapter 53 is utilized which includes an electrical cord 54 that has an electrical plug 56 that can be inserted into an outlet socket to receive AC and a connector plug 58 that can be inserted into the recharge inlet 52. Once connected, the AC/DC charge delivers a 12 volt charge to the power source 38.

In an alternative embodiment of the present invention, the power source is an external battery pack (not shown) adapted for being connected to the housing 10. The battery pack may be a rechargeable high power battery pack, such as a Li-ion pack comprised of one or a plurality of cells, for example. Those skilled in the art will understand that several of the components are conventional in nature and thus a detailed explanation is omitted for purposes of brevity.

Also within the compact portable housing 10 is a light mode control means 40 that enables the device to actuate a single light mode or to cycle automatically through multiple light modes at a predetermined time interval. The light mode control means 40 consists of a microcontroller or a programmable logic circuit 42. The light mode microcontroller 42 is programmed to activate the left turn signal, the right turn signal, the brake lights, the tail lights or a cycle. The light mode microcontroller 42 can also be programmed to test for the functioning of electric trailer braking systems and/or reverse indicator lights.

The compact portable housing 10 further contains an fault detection logic means 44 which identifies and indicates the existence of a fault, the location of the fault and what type of fault is detected, if any. The fault detection logic means 44 consists of a microcontroller or a programmable logic circuit 46 which microcontroller is programmed to activate the main fault indicator light 30 and location fault indicator lights for the left side 32, the right side 34 and the tail lights 36.

On the first side 48 of the compact portable housing 10, as shown in FIGS. 5 and 6, is a trailer light connection port 50 compatible for directly connecting with the trailer light wiring harness (not shown).

All wiring (not shown) for connecting the power source 38, light mode microcontroller 42, fault detection microcontroller 46, connection port 50, on/off switch means 16, fault indicator lights 30, 32, 34, 36, recharge inlet 52 and light mode selector button 18 and lights 20, 22, 24, 26 are maintained within the housing 10.

To operate the invention, the user plugs the trail light wiring harness (not shown) into the trailer light connection port 50. The user next moves the on/off switch 16 to the "on" position, thereby enabling the power source 38. The user presses light mode selector button 18 until the desired mode is illuminated; left turn signal 20, right turn signal 22, brake lights 24, tail lights 26 or cycle mode 28. The light mode selector button 18 directs power to the selected lights on the trailer. The user can then visually observe the functioning of the trailer lights. If a fault is present in the trailer lights, the fault detection logic means 44 determines the type and location of the error and sends power to the appropriate error detection indicator or indicators 32, 34, 36. Once the user has checked the trailer lights, the on/off switch 16 is moved to the "off" position. While the light testing device is not in use, the power source 38 may be fully recharged by simply engaging the connector plug 58 of the AC/DC adapter 53 into the recharge inlet 52 and the receptacle plug 56 into a standard AC outlet.

The instant invention has been shown and described herein in what is considered to be the most practical and preferred embodiment. It is recognized, however, that departures may be made therefrom within the scope of the invention and that obvious modifications will occur to a person skilled in the art.

What is claimed is:

1. An integrated emergency breakaway system and electrical testing system for a trailer, comprising:
   a housing having an electrically interconnected testing controller and an internal power source, wherein said housing is configured to electrically connect to electrically operated brakes on a target trailer, thereby enabling electricity from the power source to be directed to the brakes to cause the brakes to operate;
   an emergency breakaway system integral with said housing and adapted to automatically supply electricity from the power source to the electrically operated brake system when the target trailer becomes disconnected from a towing vehicle; and
   said testing controller adapted to selectively cause electricity from the power source to be supplied to the electrically operated brakes to which the housing has been connected, bypassing the operation of the emergency breakaway system to supply electricity from the power source to the electrically operated brake system when the target trailer becoming disconnected from the towing vehicle.

2. The system of claim 1, wherein said testing controller is additionally adapted to determine a charge level of the power source.

3. The system of claim 2, wherein said housing additionally includes an interface screen operative to provide a visual indication of the charge level of the power source.

4. The system of claim 3, wherein said interface screen is additionally operative to provide a real time visual indication of the supply of electricity to the electrically operated brakes caused by the testing controller.

5. The system of claim 1, wherein when said testing controller causes electricity from the power source to be supplied to the electrically operated brakes to which the housing has been connected, said testing controller is adapted to cause electricity from the power source to be supplied to the electrically operated brakes for a predetermined time period in a plurality of on/off intervals, thereby operating the electrically operated brakes intermittently in a manner which allows visual inspection of the electrically operated brakes.

6. The system of claim 1, wherein said housing additionally includes an interface screen operative to provide a real time visual indication of the supply of electricity to the electrically operated brakes caused by the testing controller.

7. The system of claim 1, wherein said housing is configured to electrically connect to a lighting system integral with the target trailer, thereby enabling electricity from the power source to be directed to at least one light on the trailer to cause the at least one light to operate.

8. The system of claim 7, wherein said testing controller includes at least one of a light mode control means for enabling the device to actuate a left turn signal, right turn signal, brake lights, and tail lights light mode individually and a fault detection logic means which identifies the existence of a fault, the location of the fault and the type of fault.

9. An integrated emergency breakaway system and electrical testing system for a trailer, comprising:
   a housing having an electrically interconnected testing controller and an internal power source, wherein said housing is configured to electrically connect to electrically operated brakes on a target trailer, thereby enabling electricity from the power source to be directed to the brakes to cause the brakes to operate;
   an emergency breakaway system integral with said housing and adapted to automatically supply electricity from the power source to the electrically operated brake system when the target trailer becomes disconnected from a towing vehicle;
   said testing controller adapted to selectively cause electricity from the power source to be supplied to the electrically operated brakes to which the housing has been connected for a predetermined time period in a plurality of on/off intervals, bypassing the operation of the emergency breakaway system to supply electricity from the power source to the electrically operated brake system when the target trailer becoming disconnected from the towing vehicle, thereby operating the electrically operated brakes intermittently in a manner which allows visual inspection of the electrically operated brakes;
   said housing additionally configured to electrically connect to a lighting system integral with the target trailer, thereby enabling electricity from the power source to be directed to at least one light on the trailer to cause the at least one light to operate; and
   said testing controller having a light mode control means for enabling the device to actuate a left turn signal, right turn signal, brake lights, and tail lights light mode individually.

10. The system of claim 9, wherein said testing controller is additionally adapted to determine a charge level of the power source.

11. The system of claim 10, wherein said housing additionally includes an interface screen operative to provide a visual indication of the charge level of the power source.

12. The system of claim 9, wherein said interface screen is additionally operative to provide a real time visual indication of the supply of electricity to the electrically operated brakes caused by the testing controller.

13. The system of claim 9, wherein said light control means includes a light mode routine operative to cause electricity from the power source to be sequentially supplied to a left turn signal, the right turn signal, the brake lights, and the tail lights of the target trailer, and to cycle automatically through each of the left turn signal, the right turn signal, the brake lights, and the tail lights at a predetermined time interval.

14. The system of claim 13, wherein said testing controller includes a fault detection logic means which identifies the existence of a fault, the location of the fault and the type of fault integral therewith and said interface screen is additionally operative to provide a real time visual indication of faults identified by the fault detection logic means.

15. A method for testing electrically operated brakes on a trailer from an integrated braking and testing system, comprising the steps of:
   providing a housing having an electrically interconnected testing controller, an internal power source, and an emergency breakaway system integral, wherein said emergency breakaway system is adapted to automatically supply electricity from the power source to the electrically operated brake system when the target trailer becomes disconnected from a towing vehicle;

connecting said housing to electrically operated brakes on a target trailer such that electricity from the power source can be directed to the electrically operated brakes; and initiating by said testing controller an activation routine which bypasses the operation of the emergency breakaway system to supply electricity from the power source to the electrically operated brake system when the target trailer becomes disconnected from the towing vehicle, wherein said activation routine is operative to cause electricity from the power source to be supplied to the electrically operated brakes to which the housing has been connected for a predetermined time period in a plurality of on/off intervals, thereby selectively operating the electrically operated brakes intermittently in a manner which allows visual inspection of the electrically operated brakes.

16. The method of claim 15, additionally comprising the step of determining by said testing controller a charge level of the power source.

17. The method of claim 16, additionally comprising the step of displaying by an interface screen integral with the housing a visual indication of the charge level of the power source.

18. The method of claim 15, additionally comprising the step of displaying by an interface screen integral with the housing a real time visual indication of the supply of electricity to the electrically operated brakes caused by the testing controller.

19. The method of claim 15, additionally comprising the step of connecting said housing to a lighting system integral with the target trailer, thereby enabling electricity from the power source to be directed to at least one light on the trailer to cause the at least one light to operate.

20. The method of claim 19, additionally comprising the step of initiating by said testing controller an light mode routine operative to cause electricity from the power source to be sequentially supplied to a left turn signal, the right turn signal, the brake lights, and the tail lights of the target trailer, and to cycle automatically through at least two of the left turn signal, the right turn signal, the brake lights, and the tail lights at a predetermined time interval.

* * * * *